United States Patent
Takahashi

(10) Patent No.: US 7,745,798 B2
(45) Date of Patent: Jun. 29, 2010

(54) DUAL-PHOSPHOR FLAT PANEL RADIATION DETECTOR

(75) Inventor: Kenji Takahashi, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 183 days.

(21) Appl. No.: 11/599,404

(22) Filed: Nov. 15, 2006

(65) Prior Publication Data
US 2010/0127279 A1    May 27, 2010

(30) Foreign Application Priority Data
Nov. 15, 2005   (JP)   ............................. 2005/329564

(51) Int. Cl.
G01T 1/20    (2006.01)
(52) U.S. Cl. .............................. 250/370.11; 250/370.09
(58) Field of Classification Search ............. 250/370.11
See application file for complete search history.

(56) References Cited

U.S. PATENT DOCUMENTS

| | | | |
|---|---|---|---|
| 5,187,369 A | | 2/1993 | Kingsley et al. |
| 5,436,458 A * | | 7/1995 | Tran et al. ............... 250/370.09 |
| 6,383,664 B2 * | | 5/2002 | Bernius et al. .............. 428/690 |
| 6,541,773 B1 * | | 4/2003 | Iwabuchi et al. ....... 250/370.11 |
| 6,762,473 B1 * | | 7/2004 | Goushcha et al. ........... 257/443 |
| 7,262,088 B2 * | | 8/2007 | Kodaira et al. .............. 438/197 |
| 7,323,692 B2 * | | 1/2008 | Rowlands et al. ...... 250/370.09 |
| 2001/0008271 A1 * | | 7/2001 | Ikeda et al. ............ 250/370.09 |
| 2005/0095945 A1 * | | 5/2005 | Chang et al. .................. 445/25 |
| 2006/0151708 A1 * | | 7/2006 | Bani-Hashemi et al. ....................... 250/370.11 |
| 2008/0001148 A1 * | | 1/2008 | Nishi et al. .................... 257/53 |

FOREIGN PATENT DOCUMENTS

| | | |
|---|---|---|
| JP | 59-211263 A | 11/1984 |
| JP | 2-164067 A | 6/1990 |
| JP | 7-27864 A | 1/1995 |
| JP | 7-27865 A | 1/1995 |
| JP | 9-145845 A | 6/1997 |

OTHER PUBLICATIONS

Stauth, David, "Major Advances Made in Transparent Electronics"; published Dec. 28, 2004 [retrieved on Jan. 29, 2008]. Retrieved from the Internet: URL:<www.eurekalert.org/pub_releases/2004-12/osu-mam122804.php>.*

L. E. Antonuk ., et al, "Signal, Noise, and readout considerations in the development of amorphous silicon photodiode arrays for radiotherapy and diagnostic x-ray imaging" SPIE, vol. 1443, pp. 108-119, 1991.

* cited by examiner

*Primary Examiner*—David P Porta
*Assistant Examiner*—Yara B Green
(74) *Attorney, Agent, or Firm*—Sughrue Mion, PLLC

(57) ABSTRACT

A solid state radiation detector capable of improving the sharpness of obtained radiation images. The solid state radiation detector includes: two scintillator layers that convert irradiated radiation to light; and a solid state photodetector, disposed between the two scintillators, that detects the light converted by the two scintillator layers and converts the detected light to electrical signals. Here, the scattering length of each of the scintillators is not greater than 100 μm for the light propagating in the direction parallel to the surface of the scintillator.

7 Claims, 2 Drawing Sheets

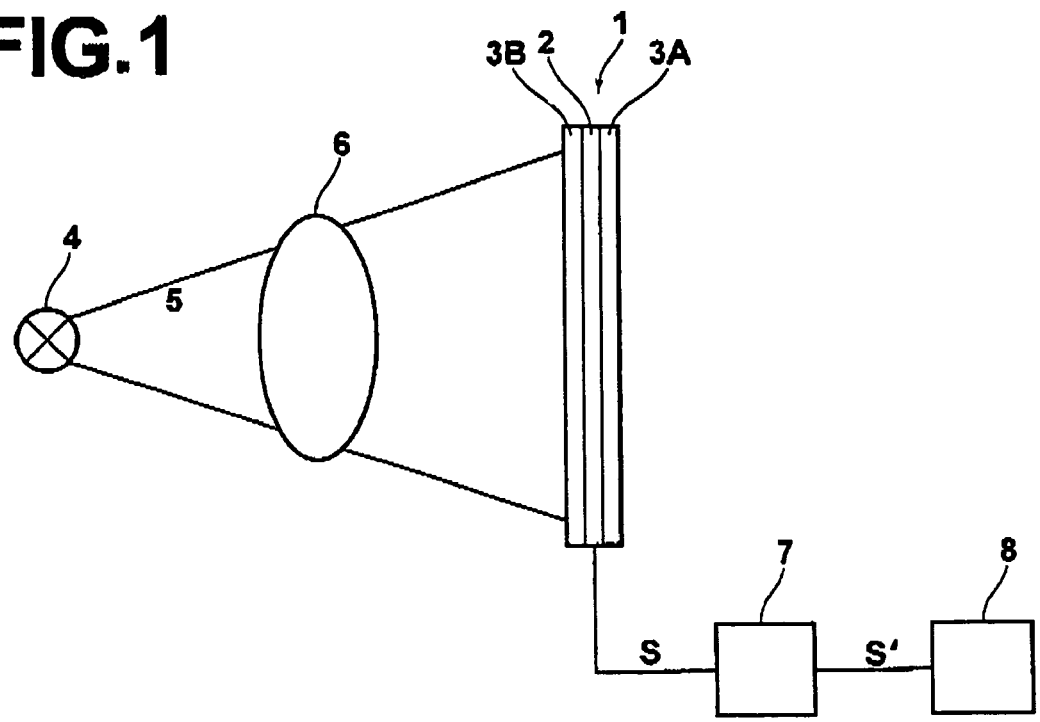
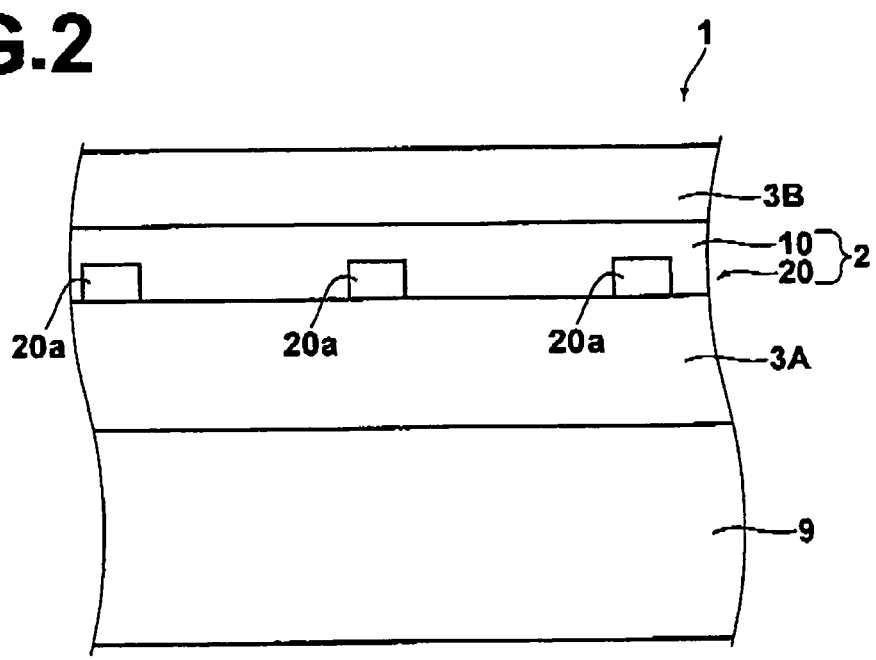

DUAL-PHOSPHOR FLAT PANEL RADIATION DETECTOR

BACKGROUND OF THE INVENTION

1. Field of the Invention

The present invention relates to a radiation detector, more specifically, to a radiation detector that employs a combination of scintillator and solid state photodetector.

2. Description of the Related Art

Radiation detectors formed of a solid state photodetector and a scintillator, which converts radiation to visible light, layered on top of another are proposed as described, for example, in Japanese Unexamined Patent Publication Nos. 59(1984)-211263 and 2(1990)-164067, U.S. Pat. No. 5,187,396, and "Signal, noise, and readout considerations in the development of amorphous silicon photodiode arrays for radiotherapy and diagnostic x-ray imaging", L. E. Antonuk et al., SPIE, Vol. 1443, pp. 108-119, 1991. The solid state photodetector includes, for example, a substrate made of silica glass with a thickness of 3 mm on which a transparent conductive layer and a conductive layer are formed with an amorphous semiconductor layer sandwiched therebetween. The transparent conductive layer includes a plurality of signal lines, and the conductive layer includes a plurality of scanning lines, which are pattern formed in a matrix form so that they are disposed orthogonal to each other.

In the radiation detectors described above, however, the solid state photodetector is disposed behind the scintillator viewed from the direction from which the radiation is irradiated, so that the visible light converted by the scintillator is absorbed or scattered by the scintillator itself before reaching the solid state photodetector. Consequently, the visible light detection efficiency of the photodetector is deteriorated, and the sharpness of the obtained radiation image is degraded.

In the meantime, Japanese Unexamined Patent publication No. 7(1995)-027864 discloses a radiation detector in which sharpness degradation is prevented by changing the arrangement order of the scintillator and solid state photodetector, i.e., the solid state photodetector is disposed in front of the scintillator viewed from the direction from which the radiation is irradiated.

Further, Japanese Unexamined Patent Publication No. 7(1995)-027865 proposes a radiation detector in which a scintillator is provided on each side of the solid state photodetector, and irradiated radiation is converted to light by the scintillators to improve the detective quantum efficiency (DQE) compared to the conventional radiation detector having a scintillator only on one side.

The radiation detector proposed in Japanese Unexamined Patent Publication No. 7(1995)-027865, however, includes a substrate for supporting the solid state photodetector, which has a thickness greater than several hundred micrometers to ensure sufficient strength. Further, the rear light receiving surface of the solid state photodetector viewed from the direction from which the radiation is irradiated is arranged such that it invariably receives fluorescence transmitted through the substrate, so that the fluorescence is dispersed while transmitting through the substrate, causing a problem of degraded image sharpness.

Still further, Japanese Unexamined Patent Publication No. 9(1997)-145895 proposes a radiation detector that has solved the aforementioned problem by using a fluorescent glass substrate, as the scintillator disposed behind the solid state photodetector viewed from the direction from which the radiation is irradiated, on which the solid state photodetector is integrally formed.

In the radiation detector proposed in Japanese Unexamined Patent Publication No. 9(1997)-195895, however, the fluorescent glass substrate disposed behind the solid state photodetector viewed from the direction from which the radiation is irradiated also has high transparency to light propagating in the direction parallel to the surface of the fluorescent glass substrate. Thus, the visible light converted by the fluorescent glass substrate is spread within the substrate, causing a problem of degraded sharpness of obtained radiation images.

In view of the circumstances described above, it is an object of the present invention to provide a radiation detector capable of improving the sharpness of radiation images.

SUMMARY OF THE INVENTION

The radiation detector of the present invention is a radiation detector that includes: two scintillator layers that convert irradiated radiation to light; and a solid state photodetector, disposed between the two scintillator layers, that detects the light converted by the two scintillator layers, and converts the detected light to electrical signals. Here, the scattering length of each of the scintillators is not greater than 100 μm for the light propagating in the direction parallel to the surface of the scintillator.

The referent of "radiation" as used herein means X-rays, γ-rays, β-rays, α-rays, neutron rays, and the like (including ultraviolet rays). The referent of "light converted by the scintillators" as used herein means primarily visible light (including ultraviolet and infrared light).

Preferably, the distance between the surfaces of the two scintillator layers facing each other is less than or equal to 40 μm.

The solid state photodetector may includes: a photoconductive layer that shows conductivity by receiving light; and thin film transistors for outputting electrical signals, the photoconductive layer and thin film transistor being layered on top of another, or arranged in a planar fashion.

Here, the thin film transistors may be thin film transistors formed on a substrate and peel transferred from the substrate.

Further, the thin film transistors may be thin film transistors with the substrate, on which the thin film transistor is formed, being thinned or removed by a chemical dissolution method or a polishing method.

Still further, the thin film transistors may be thin film transistors formed on a substrate peelably disposed on a support and peeled off the support together with the substrate.

The thin film transistors may be transparent thin film transistors.

The referent of "scattering length" as used herein means an average rectilinear propagation distance of light before being scattered once.

The radiation detector of the present invention includes: two scintillator layers that convert irradiated radiation to light; and a solid state photodetector that detects the light converted by the two scintillator layers and converts the detected light to electrical signals, the solid state detector being disposed between the two scintillators. Here, the scattering length of each of the scintillators is not greater than 100 μm for the light propagating in the direction parallel to the surface of the scintillator. Thus, the average rectilinear propagation distance of light scattered in the direction parallel to the surface of the scintillator is small in each scintillator, so that the dispersion of the light in the direction parallel to the surface of the scintillator may be prevented, thereby the sharpness of the obtained radiation image may be improved.

In the radiation detector, if the distance between the surfaces of the two scintillator layers facing each other is less than or equal to 40 μm, the sharpness of the resultant radiation image may be maintained, and as a whole, high quality radiation images may be obtained.

If the solid state photodetector is a photodetector constituted by a thin film transistor and a photoconductive layer layered on top of another, or arranged in a planar fashion, the structure described above may be realized, and the light from the two scintillators may be used effectively.

Here, if the thin film transistors are thin film transistors formed on a substrate and peel transferred from the substrate, the thickness of the solid state photodetector disposed between the two scintillator layers may be reduced by removing the substrate. This may reduce the distance between the surfaces of the two scintillator layers facing each other.

Further, if the thin film transistors are thin film transistors with the substrate, on which the thin film transistor is formed, being thinned or removed by a chemical dissolution method or a polishing method, the thickness of the solid state photodetector disposed between the two scintillator layers may be reduced by reducing the thickness of the substrate. This may reduce the distance between the surfaces of the two scintillator layers facing each other.

Still further, if the thin film transistors are thin film transistors formed on a substrate peelably disposed on a support and peeled off the support together with the substrate, the thickness of the solid state photodetector disposed between the two scintillator layers may be reduced by reducing the thickness of the substrate peelably disposed on the support. This may reduce the distance between the surfaces of the two scintillator layers facing each other.

In particular, if the thin film transistors are transparent, the light irradiated thereon from the two scintillators may also be used effectively, so that the image quality may be further improved.

BRIEF DESCRIPTION OF THE DRAWINGS

FIG. 1 is a drawing illustrating an embodiment of the radiation detector of the present invention.

FIG. 2 is a partially enlarged view of the radiation detector of the present invention illustrating the schematic construction thereof.

DESCRIPTION OF THE PREFERRED EMBODIMENTS

Figure 3:
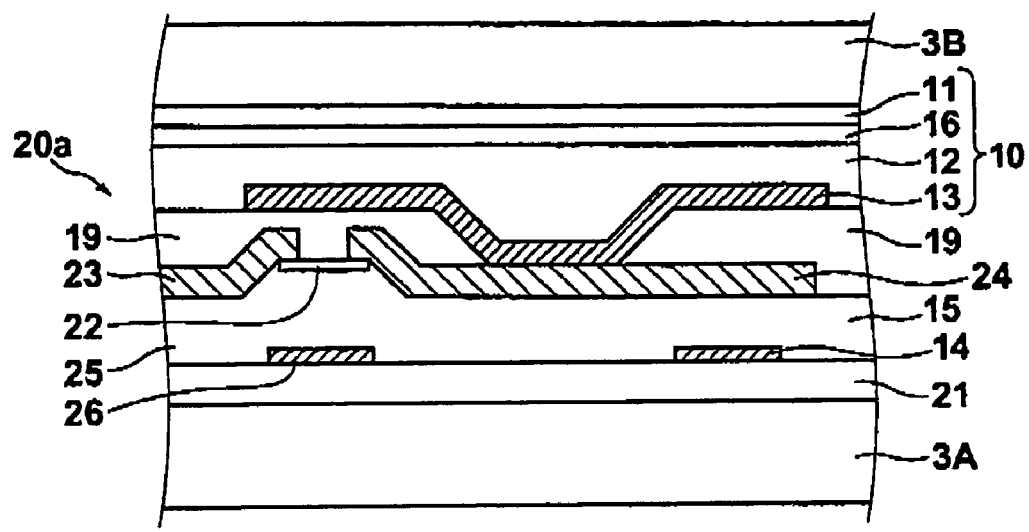
FIG. 3 is a partially enlarged view of the radiation detector illustrating a single element of the solid state photodetector.

Hereinafter, an exemplary embodiment of the present invention will be described with reference to accompanying drawings.

FIG. 1 is a drawing illustrating an embodiment of the radiation detector of the present invention. As shown in FIG. 1, a radiation detector 1 of the present embodiment includes the following layers layered in the order listed below: a first scintillator 3A, a solid state photodetector 2, and a second scintillator 3B. Thus, the solid state photodetector 2 is disposed between the two scintillator layers 3A, 3B in sandwiched manner.

As shown in FIG. 2, the radiation detector 1 includes a base 9 on which the first scintillator 3A, solid state photodetector 2, and second scintillator 33 are layered. The solid state photodetector 2 includes: a photoconductive section 10 formed of a photoconductive layer 12 and a thin film transistor layer 20 layered on top of another. The thin film transistor layer 20 is a layer in which multitudes of thin film transistors 20a are formed two-dimensionally at a desired pixel pitch. A single transistor 20a and the corresponding portion of the photoconductive section 10 constitute a single solid state detection element. That is, the solid state photodetector 2 is formed of multitudes of solid state detection elements disposed two-dimensionally.

The first and second scintillators 3A, 3B convert the irradiated radiation to light, which are formed in plate-shapes. Each of the first and second scintillators 3A, 3B is a layer including a phosphor that absorbs radiation and emits visible light or ultraviolet light (hereinafter referred to as "radiation absorbing phosphor"). In particular, it is preferable that each of the scintillators 3A, 3B is a layer that includes a phosphor containing an element having an atomic number greater than or equal to 39 with a film density greater than or equal to 3.5. Each of the scintillators 3A, 3B is formed so as to have high scattering properties in the direction parallel to the surface of the scintillator, i.e., the plane opposite to the solid state detector 2 using a material that includes such phosphor as described above. More specifically, it is formed such that the scattering length of the light scattering in the direction parallel to the surface of the scintillator is not greater than 100 μm, preferably not greater than 50 μm, and more preferably not greater than 20 μm. Here, the referent of "scattering length" means an average rectilinear propagation distance of light before being scattered once, and the shorter the scattering length, the higher the light scattering properties. As described above, in each of the scintillators, by making the average rectilinear propagation distance of light scattered in the direction parallel to the surface of the scintillator not greater than 100 μm, preferably not greater than 50 μm, and more preferably not greater than 20 μm, the dispersion of the light in the direction parallel to the surface of the scintillator may be prevented, thereby the sharpness of the obtained radiation image may be improved.

Preferably, the scattering length of the light scattering in the direction orthogonal to the surface of the scintillator is sufficiently longer compared to the thickness of the scintillator in order to ensure sufficient light transparency in the direction orthogonal to the surface of the scintillator.

The scattering length SL in the direction parallel to the surface of the scintillator may be calculated by the calculation method based on the Kubelka theory. More specifically, three or more film samples having composition identical to the direction parallel to the surface of either the first scintillator 3A or second scintillator 3B and different thicknesses with each other, and the thickness and transmittance of each film sample are measured. The transmittance may be measured by a spectrophotometer. For the measurement of the transmittance, collimating light is used. Here, it is assumed that the thickness of the film sample to be d (μm), the scattering length SL of the film sample to be 1/α (μm), the absorption length (average free distance before light is absorbed) of the sample film to be 1/β, and the transmittance of the film sample to be T (%). Further, a light intensity distribution I(Z) at a depth Z is separated into a component i(Z) propagating from the front to rear side of the sample film and a component j(Z) propagating from the rear to front side thereof. That is, I(Z)=i(Z)+j(Z).

In the system described above, the increase and decrease in the light intensity at a micro thickness dz of the film at a given depth Z may be calculated by solving the following simultaneous differential equations based on the Kubelka theory.

$$di/dz = -(\beta+\alpha)i + \alpha j \quad (1)$$

$$dj/dz = (\beta+\alpha)j - \alpha i \quad (2)$$

In the equations shown above, if the following are assumed: $\gamma^2=\beta(\beta+2\alpha)$, $\xi=(\alpha+\beta-\gamma)/\alpha$, $\eta=(\alpha+\beta+\gamma)/\alpha$ and integral constants to be K and L, the general solutions of i and j in the simultaneous differential equations described above may be expressed by the following formulae.

$$i(Z)=K\exp(-\gamma Z)+L\exp(\gamma Z)$$

$$j(Z)=K\xi\exp(-\gamma Z)+L\eta\exp(\gamma Z)$$

The transmittance T of a sample film with a thickness d is, T=i(d)/i(0). Here, if there will be no return light (i.e., j (d)=0) when measuring the transmittance of a stand-alone film sample, the transmittance T may be expressed by the following formula (3) as the function of the thickness of the film sample.

$$T(d)=(\eta-\xi)/(\eta\exp(\gamma Z)-\xi\exp(-\gamma z)) \qquad (3)$$

By substituting the measured transmittance and thickness d of each of the film samples to the equation 3, and optimizing them using the least square method or the like, the scattering length $SL=(1/\alpha)$, and absorption length, $1/\beta$ may be obtained.

Each of the first and second scintillators 3A, 3B may be formed such that the scattering length of the light scattering in the direction parallel to the surface of the scintillator is not greater than 100 μm, preferably not greater than Hum, and more preferably not greater than 20 μm using a material having anisotropic light scattering properties, such as a needle crystal of cesium halide, like CsI:Tl, CsI:Na, or CsBr:Eu, or the like.

Further, each of the scintillators 3A, 3B may also be formed such that the scattering length of the light scattering in the direction parallel to the surface of the scintillator is not greater than 100 μm, preferably not greater than 50 μm, and more preferably not greater than 20 μm using a fluorescent material, such as $Ln_2O_2s$: Ln' $Ln_2O_3$: Ln', $LnTaO_4$: Ln', LnOX: Ln', BaFX:Eu, $Ln_2SiO_5$: Ln', $LnAlO_3$: Ln' (here, Ln is at least one element selected from a group consisting of: Y, La, Gd, and Lu; Ln' is at least one element selected from a group consisting of: Ce, Pr, Nd, Sm, Eu, Tb, Dy, Ho, Er, Tm, and Yb; and X is at least one halogen element), or the like.

Each of the scintillators 3A, 3B may be a scintillator formed of a radiation absorbing phosphor and a binder that inclusively support the phosphor in distributed state, or formed of a radiation absorbing phosphor or its material through a vapor deposition method, such as evaporation, sputtering, CVD, or the like. Note that the scintillator 3A may be a ceramic scintillator.

FIG. 3 is an enlarged view of a single solid state detection element of the solid state detector 2.

As already described, the solid state photodetector 2 is formed of the photoconductive section 10 and thin film transistor layer 20 (hereinafter referred to as "TFT layer 20").

As shown in FIG. 3, each TFT 20a of the TFT layer 20 includes a thin substrate 21 on which a source electrode 23 and a drain electrode 24 with a semiconductor film 22 (amorphous silicon film (a-Si layer), amorphous oxide semiconductor film (a-$InGaZnO_4$ layer) or the like) sandwiched therebetween, and a gate electrode 26 through a gage insulation film 25 are formed. An insulation layer 19 that covers the drain electrode 24, gate insulation film 25, and the like is formed on the side of the TFT layer 20 facing the photoconductive section 10.

If an a-Si layer is used as the semiconductor film 22, the film 22 absorbs light, i.e., not transparent, but if an a-In $GaZnO_4$ layer is used as the semiconductor film 22, the film 22 is transparent.

The gate insulation film 25 is transparent, and each of the electrodes 23, 24, and 26 is made of ITO or IZO, which is a transparent oxide conductor.

When a-Si is used as the semiconductor film 22 of the TFT, the effects of one of the scintillators are reduced due to light absorption which occurs at a place where a-Si is present, but other region is transparent, so that sufficient effects of improved radiation-to-light conversion efficiency may be obtained as a whole compared to the case in which the scintillator is provided only on either side of the solid state photodetector 2. In the mean time, when a transparent semiconductor, such as a-$InGaZnO_4$, is used as the semiconductor film 22, a radiation detector that maximally utilizes the two scintillator effects may be created since there will be no light absorption at the TFT section in this case.

Transparent TFTs using an amorphous oxide semiconductor film (a-$InGaZnO_4$) is described, for example, in an article "Room-temperature fabrication of transparent flexible thin-film transistors using amorphous oxide semiconductors" by K. Nomura et al., Nature, Vol. 432, pp. 488-492, 2004. The transparent TFTs are high performance transparent thin film transistors (TFTs) which are achieved by using In—Ga—Zn—O system amorphous oxide semiconductors in the active layers. The amorphous semiconductor used in the active layer has an electron mobility not less than ten times that of the amorphous silicon or organic semiconductor [~10 $cm^2/(V \cdot s)$], and the characteristics of the transistor, including saturation current, switching speed, and the like are improved not less than tenfold. In—Ga—Zn—O system amorphous oxide semiconductor is described, for example, in an article "Transparent flexible transistor using amorphous oxide semiconductors as channel layer" by H. Hosono et al., OYO BUTURI, Vol. 74, No. 7, pp. 910-916, 2005.

Here, as the distance between the surfaces of the two scintillator layers facing each other becomes greater, the blurriness of the image also becomes greater, that is, the sharpness of the image is more degraded. The distance between the two scintillators may be reduced to less than or equal to 40 μm, or further approximately to 30 μm by thinning the solid state detector 2, thereby a sharp image may be obtained.

Hereinafter, a method for thinning or removing the substrate 21 used in the manufacturing process of the TFT layer 20 will be described as one of the methods for thinning the solid state detector 2.

The substrate 21 may be removed by peel transferring the TFT layer 20 as described, for example, in Japanese Unexamined Patent Publication Nos. 2000-133809, 2003-066858, and 2003-045890.

Further, the substrate 21 may be thinned or removed by the chemical dissolution method or polishing method as described, for example, in Japanese Unexamined Patent Publication Nos. 8 (1996)-278519, 2003-280035, and 2003-330004.

Still further, TFT layer 20 may be formed on a thin substrate 21 which is peelably provided on a tentatively used thick support, and a photoconductive section 10 is layered thereon. Thereafter, the substrate 21 is peeled off the tentative support. In this way, a thin substrate 21 may be realized.

The photoconductive section 10 is a section that becomes conductive when exposed to light, and includes a photoconductive layer 12 that performs photoelectric conversion, and transparent electrodes 11 and 13 which are disposed opposite to each other across the photoconductive layer 12. It further includes an electron blocking layer 16 between the transparent electrode 11 and photoconductive layer 12 for blocking the electron injection from the transparent electrode 11 to the photoconductive layer 12. Note that in the case that the bias is positive, the photoconductive layer 12 may be that which blocks hole injection. Alternatively, a hole injection blocking layer (not shown) may be provided between the photoconductive layer 12 and the electrode 13. The solid state photodetector 2 of the present embodiment includes a storage section 15 for storing charges generated in the photoconductive section 10, and the charges stored in the storage section 15 are outputted by the TFTs. The storage section 15 is formed of the transparent electrode 24, transparent electrode 14, and insulation layer 25 sandwiched by the two electrodes. Here, the electrode 14 that forms the storage section 15 is not necessarily transparent. But the use of transparent electrode may improve the light conversion efficiency.

In the present embodiment, the description has been made of a case in which the radiation detector of the present invention includes a solid state photodetector formed of a photoconductor layer and a transistor layer layered on top of another, but the radiation detector of the present invention may also have a structure in which the solid state photodetector formed of a TFT portion and a photoconductive layer arranged in a planar fashion as described, for example, in Japanese Patent No. 3066999 (Japanese Unexamined Patent Publication No. 8 (1996)-116044) is sandwiched by two scintillator layers. The layering technique for layering a photoconductive layer on a TFT layer not yet having a photoconductive layer is described in "Image sensors combining an organic photoconductor with a-Si:H matrix addressing", R. A. Street et al., Journal of Non-Crystalline Solids, Vols. 299-302, pp. 1240-1244, 2002 and the present embodiment may use such layering technique.

A photoconductive layer may be layered on TFTs by continuously forming the photoconductive layer thereon using, for example, spin coating or dip coating method. Then, the photoconductive layer is sandwiched by the transparent electrodes, corresponding to pixels, connected to TFTs, and the continuously formed transparent electrode on the opposite side. Further, the function of the photoconductive layer may be optimized by forming the photoconductive layer with a charge generation layer and a charge transport layer layered on top of another. As for the charge generation layer, benzimidazole perylene, hydroxygallium phthalocyanine, titanyl phthalocyanine and the like are known. As for the charge transport layer, tetraphenyldiamine and the like are known. Further, inorganic photoconductive materials including a-Se and the like may also be used.

Hereinafter, the radiation image recording process using the radiation detector 1 of the present invention will be described briefly.

X-rays 5 emitted from X-ray source 4 are irradiated on a subject 6 and transmitted through the subject 6. The X-rays 5 transmitted through the subject 6 are irradiated on the radiation detector 1. A part of the X-rays 5 irradiated on the radiation detector 1 is converted to visible light by the second scintillator 3B, and others are transmitted through the solid state photodetector 2 and reach the first scintillator 3A. Here, when transmitting through the solid state photodetector 2, the X-rays reach the first scintillator 3A and converted to visible light with substantially no attenuation. Each of the scintillators 3A, 3B emits visible light having an intensity corresponding to the amount of X-rays 5 absorbed thereby. The visible light is photoelectrically converted in the photoconductive layer 12, and charges are stored in the storage section 15 according to the emission intensity. Here, if the TFTs have light absorption property, the visible light emitted from the scintillator 3A is attenuated by the TFT layer 20, but if transparent TFTs are used, the visible light reaches the photoconductive layer 12 without attenuated by the TFT layer 20.

Thereafter, the charges are read out, and image signals S in the form of electrical signals are outputted.

The outputted image signals S are inputted to an information processing means 7, where predetermined image processing and the like are performed thereon to obtain processed image signals S', which are inputted to a reproducing means 8 to reproduce the radiation image of the subject 6 as a visible image.

As for the reproducing means 8, various types of reproducing means may be used, including electronic display means, such as LCD, CRT display or the like, recording means for recording the radiation image displayed on the LCD, CRT display or the like on a video printer or the like.

In the present embodiment, the solid state photodetector is formed of a photoconductive layer and a TFT layer with the photoconductive layer being disposed on the side of the radiation irradiation surface, but the TFT layer may be disposed on the side of the radiation irradiation surface instead of the photoconductive layer. Further, as the TFT layer 20, the description has been made of a case, in which each of the TFTs is formed on the thin transparent substrate 21, but the TFT layer may be provided by forming TFTs directly on the scintillator 3A or 3B.

The conventional thin film transistor uses a-Si (amorphous silicon) having light absorption property in the visible region. The provision of a scintillator on each side of the solid state photodetector, however, allows more effective use of X-rays than in the past. But, in a particularly high definition detector, the ratio of the area occupied by the TFTs is relatively high, so that the light emitted from the scintillator disposed on either side may not be used effectively, since more amount of light is attenuated by the thin film transistors, and a sufficient amount of light may not reach the photoconductive layer. As in the preferred example of the present embodiment, the use of the transparent thin film transistors allows the light emitted from the scintillators disposed on both sides may be used more effectively. The detection efficiency for the visible light converted by the scintillators may be improved. Thus, the sharpness of radiation images obtainable through the radiation detector may be improved, and as a whole, high quality radiation images may be obtained.

Even if the thin film transistor layer used in the present embodiment is transparent, there may be a case in which the structure of the TFTs is imaged on the radiation image. In such a case, the imaged structure of the TFTs may be removed by the image correction process together with the imaged structure of the scintillators. When performing the correction process, a value corresponding to a particular energy may be used as the representative value for the first order approximation for X-ray energy dependence. Of course, the correction process may also be performed using values corresponding to the respective energies.

What is claimed is:

1. A radiation detector, comprising:
   two scintillator layers that convert irradiated radiation to light; and
   a solid state photodetector that detects the light converted by the two scintillator layers and converts the detected light to electrical signals, the solid state photodetector being disposed between the two scintillators,
   wherein the scattering length of each of the scintillators is not greater than 100 μm for the light propagating in the direction parallel to the surface of the scintillator, wherein the distance between the surfaces of the two scintillator layers facing each other is less than or equal to 40 µm, and wherein the solid state photodetector comprises:
 a photoconductive layer that shows conductivity by receiving the light; and
 thin film transistors for outputting electrical signals, the photoconductive layer and thin film transistors being layered on top of another, or arranged in a planar fashion.

2. The radiation detector according to claim 1, wherein the thin film transistors are thin film transistors formed on a substrate and peel transferred from the substrate.

3. The radiation detector according to claim 1, wherein the thin film transistors are thin film transistors with the substrate, on which the thin film transistors are formed, being thinned or removed by a chemical dissolution method or a polishing method.

4. The radiation detector according to claim 1, wherein the thin film transistors are thin film transistors formed on a substrate peelably disposed on a support and peeled off the support together with the substrate.

5. The radiation detector according to claim 1, wherein the thin film transistors are transparent thin film transistors.

6. The radiation detector according to claim 1, wherein the scattering length of the light scattering in a direction orthogonal to a surface of each scintillator is longer than a thickness of the each scintillator.

7. The radiation detector according to claim 1, wherein the scattering length with respect to light of each of the scintillators that propagates in a direction parallel to the scintillators is 20 µm or less.

* * * * *